United States Patent [19]
Itoh et al.

[11] Patent Number: 4,825,418
[45] Date of Patent: Apr. 25, 1989

[54] SEMICONDUCTOR MEMORY

[75] Inventors: Kiyoo Itoh, Higashikurume; Ryoichi Hori, Nishitama, both of Japan

[73] Assignee: Hitachi, Ltd., Tokyo, Japan

[21] Appl. No.: 171,772

[22] Filed: Mar. 22, 1988

Related U.S. Application Data

[60] Continuation of Ser. No. 38,370, Apr. 14, 1987, Pat. No. 4,748,591, which is a division of Ser. No. 717,490, Mar. 29, 1985, Pat. No. 4,675,845, which is a continuation of Ser. No. 380,409, May 20, 1982, abandoned.

[30] Foreign Application Priority Data

May 29, 1981 [JP] Japan .................. 56-81042

[51] Int. Cl.[4] .................. G11C 11/40; G11C 13/00
[52] U.S. Cl. .................. 365/207; 365/189; 365/210
[58] Field of Search .................. 365/51, 190, 189, 207, 365/210

[56] References Cited

U.S. PATENT DOCUMENTS

| | | | |
|---|---|---|---|
| 4,122,546 | 10/1978 | Von Basse et al. | 365/189 |
| 4,316,265 | 2/1982 | Tanaka et al. | 365/203 |
| 4,357,685 | 11/1982 | Daniele et al. | 365/189 |
| 4,590,588 | 5/1986 | Itoh et al. | 365/51 |
| 4,675,845 | 6/1987 | Itoh et al. | 365/51 |
| 4,748,591 | 5/1988 | Itoh et al. | 365/51 |
| 4,808,305 | 10/1983 | Kuo | 365/189 |

OTHER PUBLICATIONS

1981 IEEE International Solid State Circuits Conference, "Memories and Redundancy Techniques", Eaton et al., 2-18-81, pp. 84-85.

*Primary Examiner*—Terrell W. Fears
*Attorney, Agent, or Firm*—Antonelli, Terry & Wands

[57] ABSTRACT

A semiconductor memory having a structure wherein each of data lines intersecting word lines is divided into a plurality of sub lines in its lengthwise direction, memory cells are arranged at the points of intersection between the divided sub lines and the word lines, common input/output lines are disposed in common to a plurality of such sub lines, the common input/output lines and the plurality of sub lines are respectively connected by switching elements, and the switching elements are connected to a decoder through control lines and are selectively driven by control signals generated from the decoder.

15 Claims, 21 Drawing Sheets

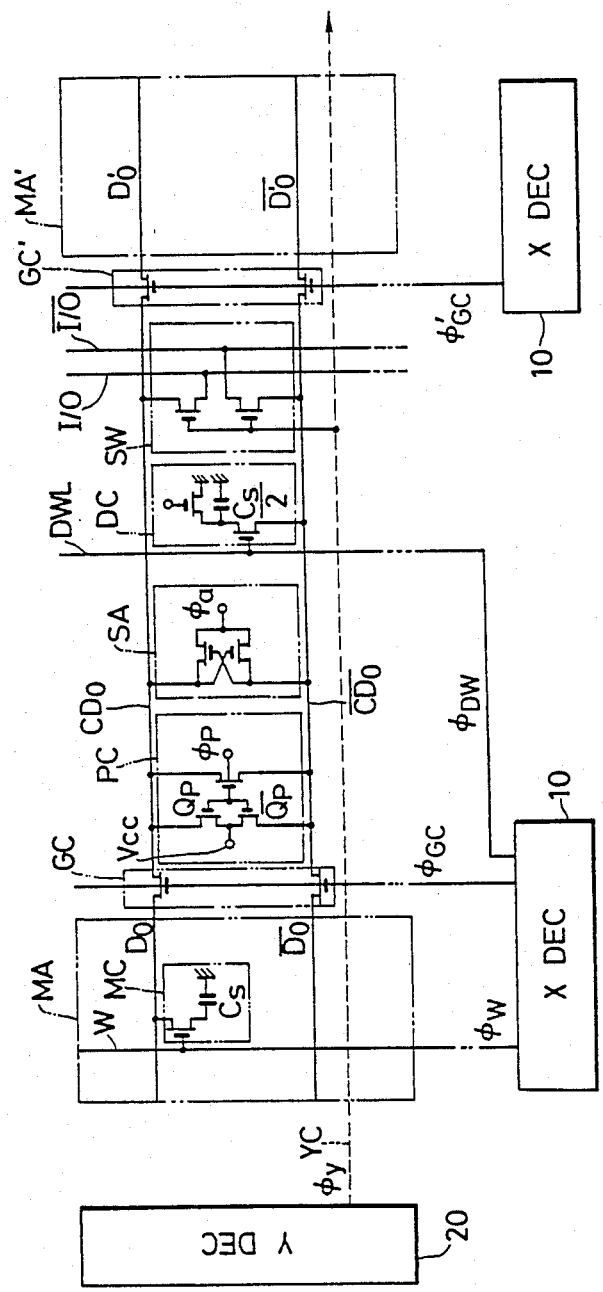

SEMICONDUCTOR MEMORY

This is a continuation of application Ser. No. 038,370, filed Apr. 14, 1987, which is a divisional application of application Ser. No. 717,490, filed Mar. 29, 1985, now U.S. Pat. No. 4,675,845, which is a continuation application of Ser. No. 380,409, filed May 20, 1982, now abandoned.

BACKGROUND OF THE INVENTION

The present invention relates to a semiconductor memory, and more particularly to a semiconductor memory device which has a high packaging density and which is advantageous for attaining a fast operation as well as a high S/N (signal-to-noise) ratio.

As a semiconductor memory has its packaging density rendered higher and its storage capacity larger, the capacity of a charge storage portion in each memory cell decreases. On the other side, the area of a memory array on a memory chip increases, and the capacitance of a data line, the length thereof, etc. increase. Accordingly, it becomes increasingly difficult to hold the features of fast operation and high S/N ratio.

In order to obtain large-capacity memory of fast operation and high S/N ratio, various contrivances have hitherto been made. An example will be described on a MOS dynamic memory which is constructed of memory cells each including one transistor and one capacitor.

In the example of FIG. 1, two memory arrays MA1 and MA2 are arranged on both the sides of circuit block Y DEC which includes a Y decoder and drivers and have sense amplifiers SA arranged on the outer sides thereof. When a memory cell MC connected to a data line $D_0$ is selected by a circuit block X DEC which contains an X decoder and drivers, a dummy cell DC connected to a data line $\overline{D_0}$ adjoining the data line $D_0$ is selected, the difference between the potentials of the data lines $D_0$ and $\overline{D_0}$ as based on the difference of the capacitances of both the cells is amplified by the sense amplifier SA, and reading is effected through common input/output lines I/O and $\overline{I/O}$. In this manner, in the example of FIG. 1, the pair of data lines which are differentially read out are arranged in adjacency to each other, to form the so-called folded data line arrangement. Therefore, the example has the merit that noise attributed to the electrical unbalance of the data lines does not develop in any substantial amount. However, when the area of the memory array becomes large with an increase in the storage capacity, the capacitance of the data line increases, so that a read-out voltage decreases. When, in this regard, the data line is shortened by increasing the number of divided memory arrays into, e.g., four memory arrays or eight memory arrays, it is possible to increase the read-out voltage and to raise the writing speed. Since, however, one Y decoder needs to be disposed for every two memory arrays and one set of common input/output lines or one sense amplifier needs to be disposed for every memory array, these peripheral circuits bring about the disadvantage of a large occupying area.

SUMMARY OF THE INVENTION

An object of the present invention is to provide a semiconductor memory of large storage capacity which suppresses an increase in the occupying area of peripheral circuits.

Another object of the present invention is to provide a semiconductor memory of large storage capacity and high packing density which is capable of fast writing and fast reading.

Still another object of the present invention is to provide a semiconductor memory of large storage capacity and high packaging density which exhibits a high S/N ratio and a high reliability.

In a semiconductor memory according to the characterizing construction of the present invention, each data line intersecting word lines is divided into a plurality of sub lines in the lengthwise direction thereof, memory cells are arranged at the points of intersection between the divided sub lines and the word lines, each common input/output line is disposed for a plurality of such sub lines in common, the common input/output and these sub lines are respectively connected by switching elements, and such switching elements are connected to a decoder through control lines and are selectively driven by control signals generated from the decoder.

In accordance with such construction, the sub lines onto which the data of the memory cells are once read out can have their capacitances made small owing to the division in the lengthwise direction, so that a reading operation of high speed and high S/N ratio is permitted. In addition, even when the number of division is increased, one decoder for addressing in the digit direction (Y decoder) suffices, so that the increase of the occupying area of peripheral circuits is not involved. In accordance with the construction, inevitably the control lines and/or the common input/output lines need to be laid in the same direction as that of the divided data lines and across the memory array. Since, however, such wiring added anew can be provided in a multilevel fashion by forming it as a layer different from that of the data lines (sub lines), the occupying area of the memory array does not especially increase.

BRIEF DESCRIPTION OF THE DRAWINGS

FIG. 5 is a circuit diagram showing a part in FIG. 3 more in detail.

DESCRIPTION OF THE PREFERRED EMBODIMENTS

Figure 1:
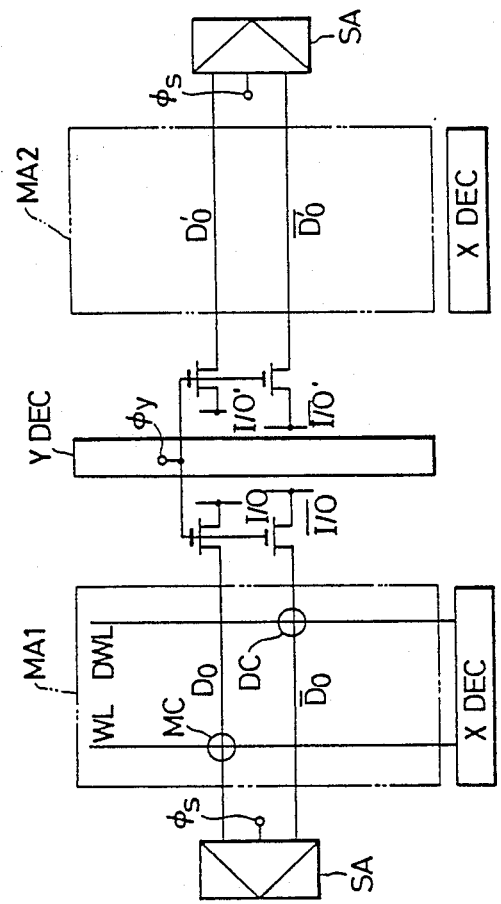
FIG. 1 is a circuit diagram showing an example of a prior art.
Figure 2:
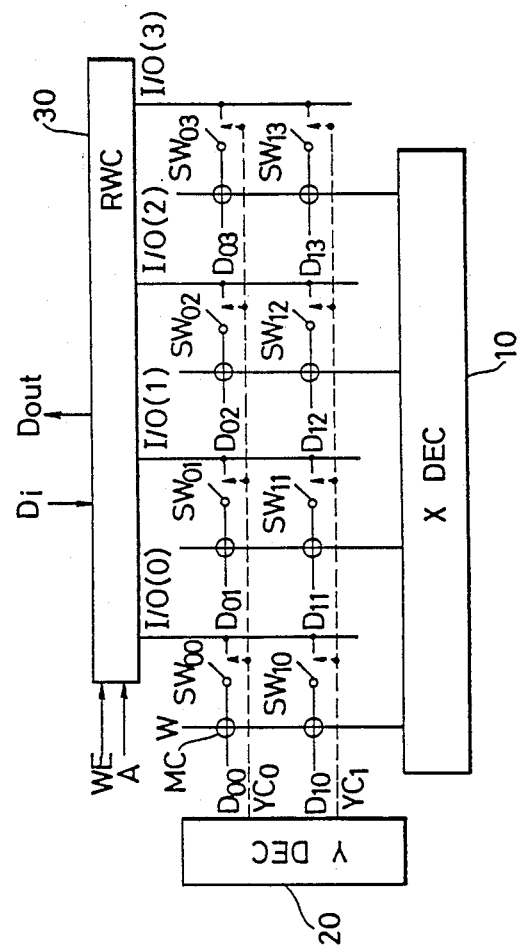
FIG. 2 is a circuit diagram showing a structure which is common to several embodiments of the present invention.

FIG. 2 conceptually shows a structure which is common to several embodiments of the present invention. In a memory wherein word lines W and data lines $D_{ij}$ are arranged into a matrix to form a memory array, each data line is divided into, e.g., $D_{00}$, $D_{01}$, $D_{02}$ and $D_{03}$ as shown in the figure. In parts of the respective divided data lines, there are disposed switches $SW_{00}$, $SW_{01}$, $SW_{02}$ and $SW_{03}$ which are controlled by an output control signal $YC_0$ provided from a circuit block 20 including a Y decoder and a Y driver. Data are exchanged through these switches between the respective data lines and common input/output lines I/O(0), I/O(1), I/O(2) and I/O(3) which are common to other divided data lines (for example, $D_{10}$). As a result, data are written into or read out from memory cells MC by a read/write controller 30.

With such construction, the data lines are divided, so that a read-out signal of high output voltage is obtained from the memory cell MC to the data line $D_{00}$ at high speed by a word selection voltage which is delivered to the selected word line W from a circuit block 10 including an X decoder and drivers. Moreover, with this construction, the increase of a chip area ascribable to the division is suppressed. The reason is that the circuit block 20 need not be laid out for each divided memory array, but that one circuit block 20 common to the sub data lines suffices.

In the construction of FIG. 2, when lines YC are formed by a manufacturing step different from that of the lines $D_{ij}$, multi-level wiring becomes possible, and hence, the area of the memory array does not increase. By way of example, it is considered that the word lines W are formed of a material adaptable to self-alignment techniques, for example, polycrystalline Si or a metal such as Mo, that the principal parts of the data lines are formed of a first layer of Al, and that the control lines YC are formed of a second layer of Al. It is also considered to form the word lines W out of a first layer of Al, the principal parts of the data lines $D_{ij}$ out of a polycrystalline Si or diffused layer, and the control lines YC out of a second layer of Al.

Figure 3:
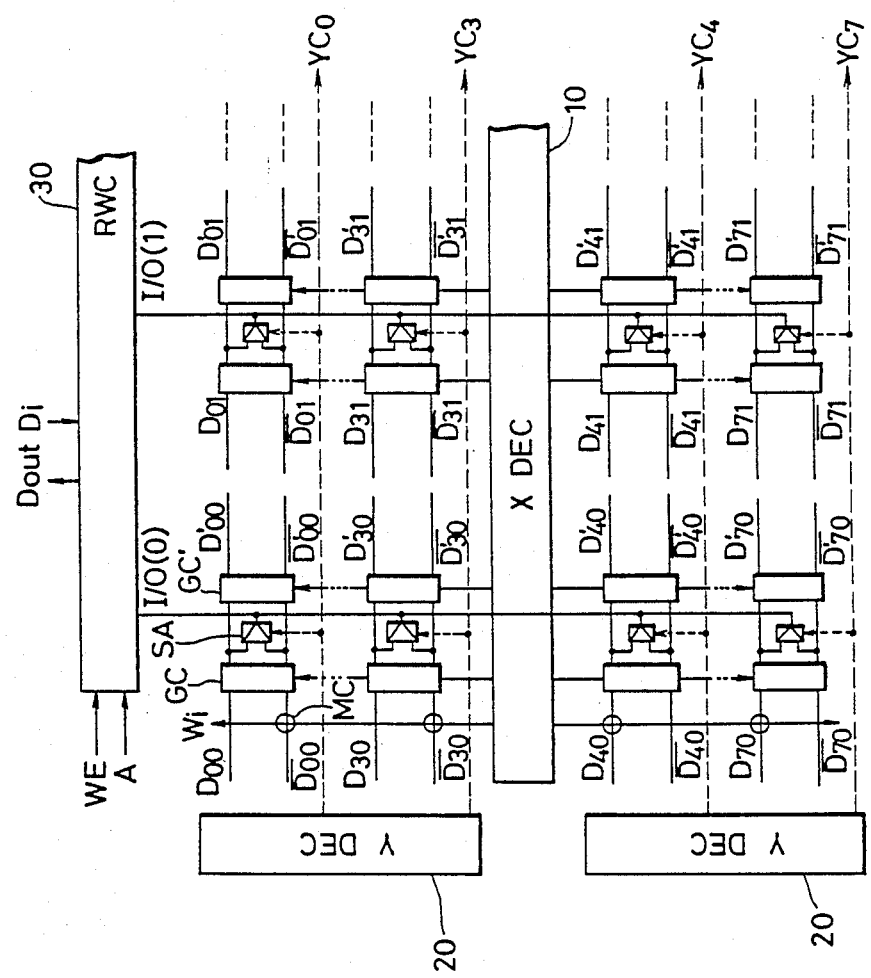
FIG. 3 is a circuit diagram of an embodiment of the present invention.

FIG. 3 shows an embodiment in which the construction of FIG. 2 is applied to a semiconductor memory having the folded data line arrangement.

A data line forming each row is divided into, e.g., $D_{00}$, $D_{00}'$, $D_{01}$ and $D_{01}'$. Pairing data lines $D_{00}$ and $\overline{D_{00}}$ are connected to sense amplifier SA through a switching circuit GC. On the other hand, pairing data lines $D_{00}'$ and $\overline{D_{00}}'$ are connected to the aforementioned sense amplifier SA through a switching circuit GC'. In this manner, the sense amplifier common to the data pair lines $D_{ij}$, $\overline{D_{ij}}$ and the other data pair lines $D_{ij}'$, $\overline{D_{ij}}'$ is disposed. A single control line $YC_0$ is disposed in correspondence with data lines $D_{00}$, $D_{00}'$, $D_{01}$, $D_{01}'$... aligned in one row and data lines $\overline{D_{00}}$, $\overline{D_{00}}'$, $\overline{D_{01}}$, $\overline{D_{01}}'$... pairing therewith. Control lines $YC_3$, $YC_4$, $YC_7$ etc. are respectively disposed in correspondence with other data pair lines.

Word lines (in the figure, only one word line $W_i$ is illustrated representatively) intersecting the data lines are selectively driven by a circuit block 10 which includes an X decoder and a word driver. Only one of the switching circuits of GC and GC' is driven at a time by a control signal $\phi_{GC}$ or $\phi_{GC}'$ from the circuit block 10. After all the information of only one of the memory cells connected with the data lines $D_{00}$, $D_{00}'$, $\overline{D_{00}}$ and $\overline{D_{00}}'$ is transmitted to one end of the sense amplifier SA. The information of a dummy cell, not shown, is transmitted to the other end of the sense amplifier SA. Signals are similarly transmitted to other sense amplifiers, and each sense amplifier differentially amplifies the transmitted signals.

All outputs from the sense amplifiers arrayed in the first column are associated with a common input/output line I/O(0). Among these sense amplifiers, only one selected by the circuit block 20 through any of the control lines $YC_0$, $YC_3$, $YC_4$, $YC_7$ etc. has its output applied to the common input/output lines I/O(0) and then transmitted to a read/write controller 30. Likewise, the outputs of the sense amplifiers arrayed in the other columns are transmitted to selected common input/output lines I/O(1) etc. The read/write controller 30 is controlled by an address signal A and a write/read control signal WE, and provides a data output $D_{out}$ corresponding to the potential of the desired one of the common input/output lines. A writing operation is similarly performed in such a way that a data input $D_i$ supplied from outside the chip is applied to the selected common input/output line and then to the selected memory cell.

Figure 4A:
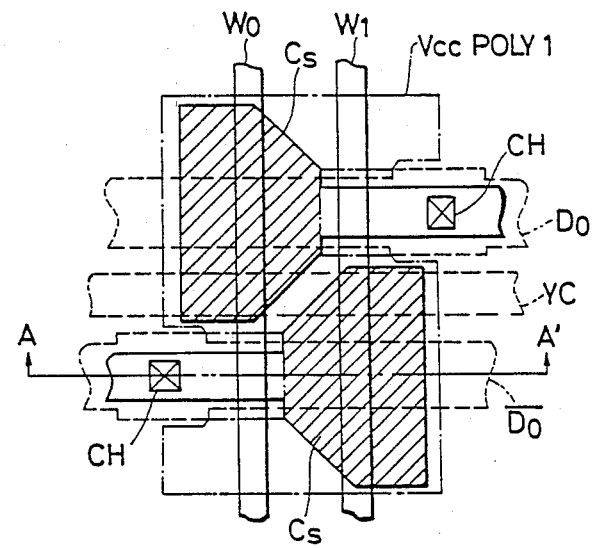
FIGS. 4A, 4B and 4C are a plan view, an equivalent circuit diagram and a sectional view of a memory cell portion in FIG. 3, respectively.
Figure 4B:
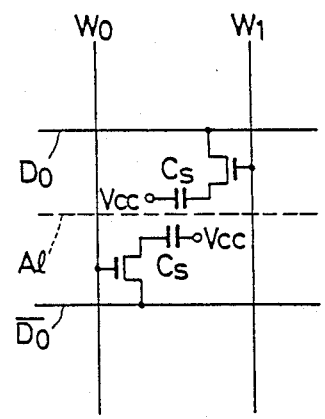
Figure 4C:
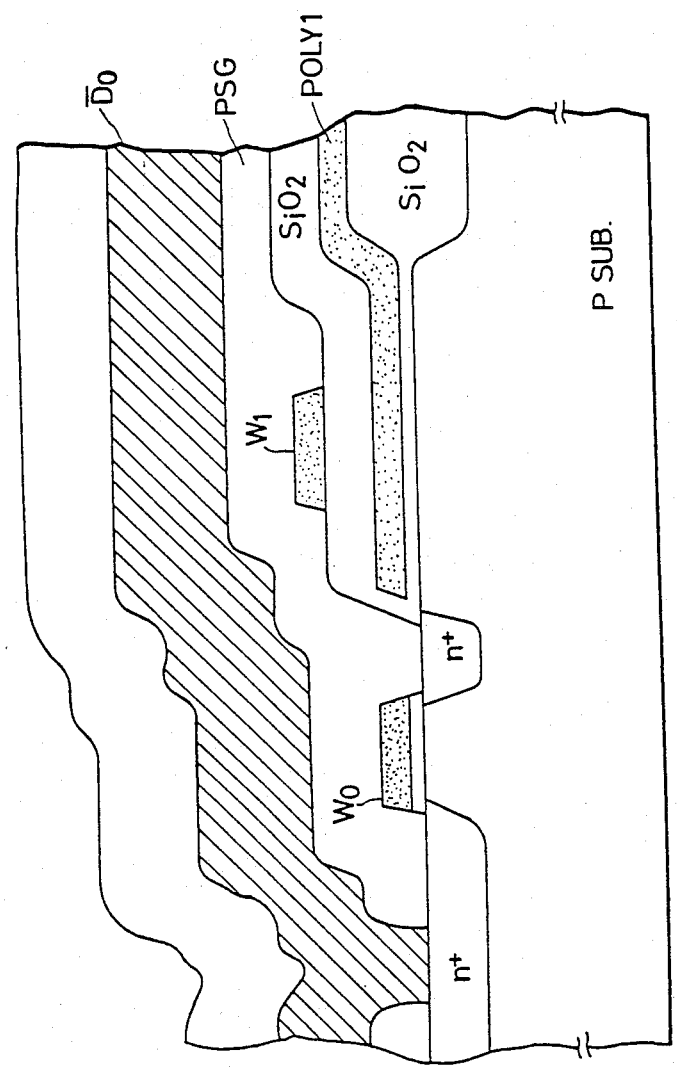

FIGS. 4A, 4B and 4C show an enlarged plan view, an equivalent circuit diagram and a sectional view of the portion of the memory array in the embodiment of FIG. 3, respectively. As seen from the equivalent circuit diagram of FIG. 4B, the plan view of FIG. 4A shows only the portion of two memory cells which are respectively connected to the pairing data lines $D_0$ and $\overline{D_0}$. A part enclosed with a dot-and-dash line indicates a first layer of polycrystalline silicon POLY I to which a supply voltage $V_{CC}$ is applied. In the part POLY I, hatched areas are parts which are formed on a silicon diode layer thinner than in the other part, and storage capacitances $C_S$ are formed by the hatched parts and a silicon substrate. The word lines $W_0$ and $W_1$ are formed of a second layer of polycrystalline silicon, and parts of them form the gates of MOS transistors. These layers are overlaid with a phosphosilicate glass layer PSG, on which the data lines $D_0$ and $\overline{D_0}$ indicated by broken lines and formed of a first layer of aluminum are formed. Symbol CH designates a contact area for the connection between the aluminum layer and an n$^+$-type diffused layer in the silicon substrate. The first layer of aluminum is overlaid with an inter-layer insulating film, on which the control line YC made of a second layer of aluminum is formed. FIG. 4C illustrates section A—A' in FIG. 4A.

As shown in FIG. 4A, the control line YC which is laid between the pairing data lines $D_0$ and $\overline{D_0}$ should desirably be arranged in the middle of these data lines. The reason is that when the control line YC is located nearer to either data line, the data lines $D_0$ and $\overline{D_0}$ come to have unequal capacitances with respect to the control line YC, which forms a cause for noise in the differential reading of signals on the data lines $D_0$ and $\overline{D_0}$.

FIG. 5 shows more in detail the sense amplifier SA and the proximate circuits which have been omitted from FIG. 3.

The data lines $D_0$ and $\overline{D_0}$ are connected to nodes $CD_0$ and $\overline{CD_0}$ through the switching circuit GC. The data lines $D_0'$ and $\overline{D_0}'$ are also connected to the nodes $CD_0$ and $\overline{CD_0}$ through the switching circuit GC'. The nodes $CD_0$ and $\overline{CD_0}$ have a precharging circuit PC, the dummy cell DC and a switching circuit SW connected thereto in addition to the sense amplifier SA.

Figure 6:
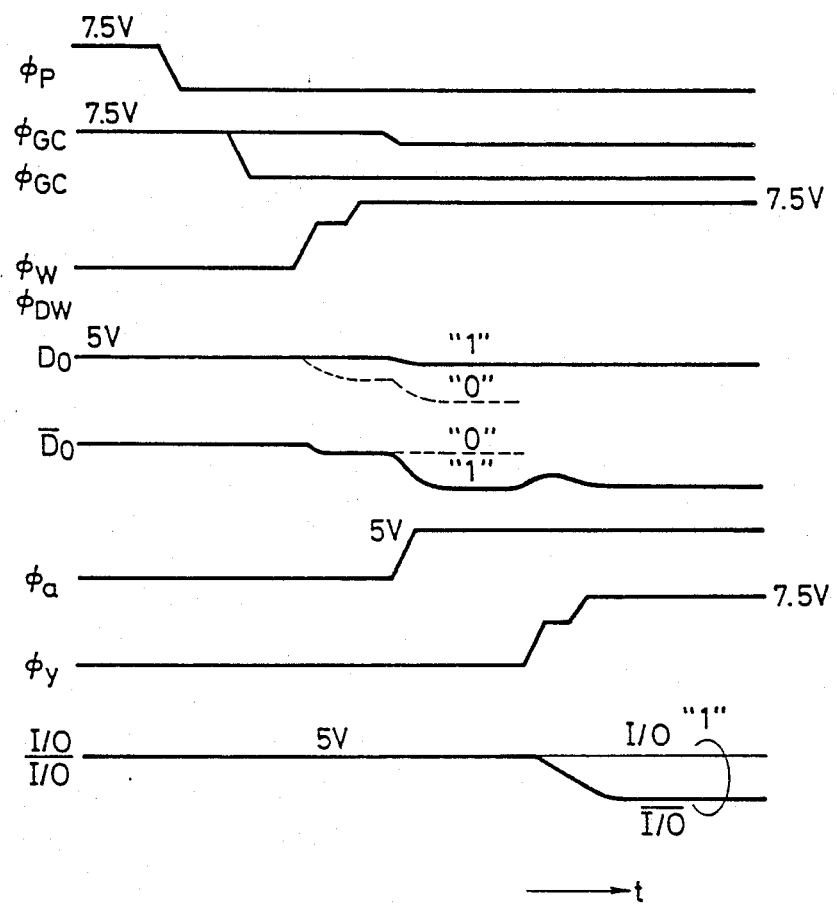
FIG. 6 is a time chart showing operations in FIG. 5, FIGS. 7 and 8 are a circuit diagram showing a part in FIG. 5 in detail and a time chart showing the operations thereof, respectively.

The embodiment will be described more in detail with reference to FIG. 6 illustrative of a time chart. First, all the nodes ($D_0$, $\overline{D_0}$, $CD_0$, $\overline{CD_0}$, $D_0'$, $\overline{D_0}'$ etc.) are precharged to a high potential by a precharge signal $\phi_p$, whereupon the word line W is selected by a word pulse $\phi_W$ provided from the X decoder. Then, all the memory cells connected to the word line are selected. By way of example, a minute signal voltage which is determined by the storage capacitance $C_S$ of the memory cell MC and the capacitance of the data line $D_0$ is delivered to this data line $D_0$ corresponding to the memory cell MC. At the same time, a reference voltage is delivered from the dummy cell CD to the node $CD_0$ by turning "on" a pulse $\phi_{DW}$. Before the word line is selected, the switching circuit GC' connected to the data line to which the memory cell to be selected does not belong is turned "off" in such a way that a control signal $\phi_{GC'}$ is brought from the high level at the precharging into a low level. In contrast, the switching circuit GC remains "on". Accordingly, signal voltages corresponding to an information from the memory cell MC appear at $D_0$ and $CD_0$, and the reference voltage for the dummy cell DC appears at $\overline{D_0}$ and $\overline{CD_0}$. Since the capacitance of the dummy cell DC is selected to be 1/2 of the storage capacitance $C_S$ of the memory cell MC, the reference voltage is set to be intermediate between the read-out voltages which appear at $D_0$ and $CD_0$ in correspondence with the information "1" and "0" of the memory cell MC. At the input terminals of the sense amplifier SA, therefore, minute fluctuating voltages corresponding to the information "1" and "0" appear at all times. Thereafter, the sense amplifier SA is operated by a start pulse $\phi_a$ so as to amplify the differential voltages. Thereafter, a control signal $\phi_y$ is delivered to the control line YC selected by the Y decoder Y DEC, and the amplified differential voltages are differentially taken out onto the pairing common input/output lines I/O and $\overline{I/O}$ via the switch SW.

The features of the present circuit arrangement are (1) that the common input/output lines are located between the memory arrays MA and MA', not on one side of each memory array, so the reading and writing operations can be performed fast, and (2) that since the precharging circuit PC and the dummy cell DC are made common to the two memory arrays MA and MA', the required area decreases accordingly. Of course, these circuits can be arranged for the respective memory arrays MA and MA' as in the prior art without being made common. In FIG. 6, the supply voltage $V_{CC}=5$ V by way of example, and the signals $\phi_P$, $\phi_{GC}$ and $\phi_{GC'}$ are set at 7.5 V in order to impress a sufficiently high voltage so that the datal lines $D_0$ and $\overline{D_0}$ may be precharged with equal voltages. The signals $\phi_W$ and $\phi_{DW}$ are set at 7.5 V in order to make the read-out voltage from the memory cell high by boosting the word line to 7.5 V with a capacitor. Since a practicable circuit therefor has been known well, it is omitted from the illustration. The signal $\phi_y$ is set at 7.5 V in order to raise the mutual conductance $g_m$ of the MOS transistors within the switching circuit SW so that the signals may be delivered from the nodes $CD_0$ and $\overline{CD_0}$ to the common input/output lines I/O and $\overline{I/O}$ at high speed.

Figure 7:
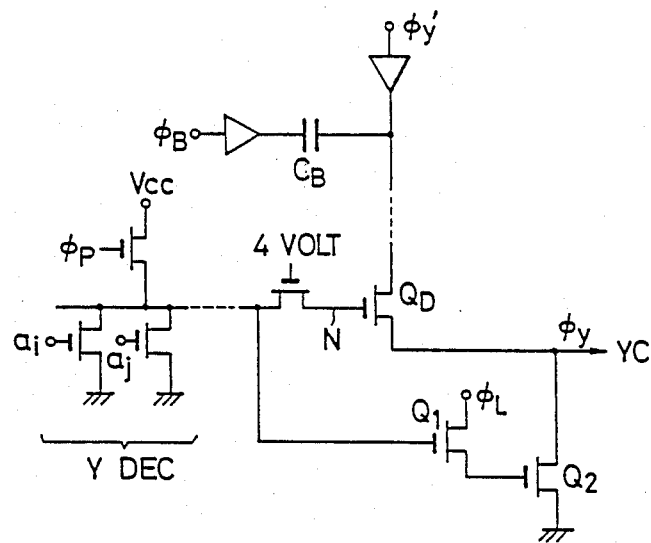
Figure 8:
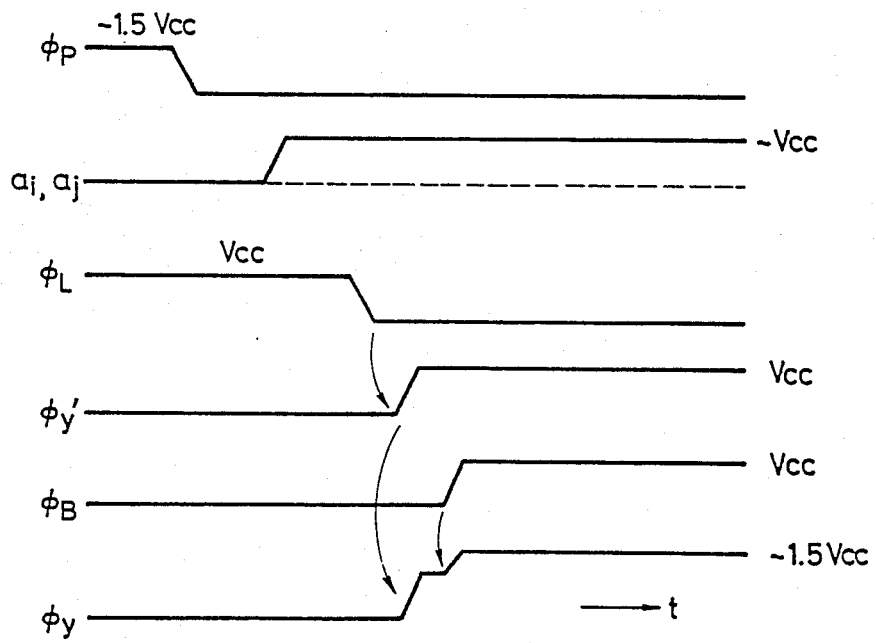

That portion in the circuit block 20 which produces the control signal $\phi_y$ boosted to 7.5 volts with respect to the supply voltage $V_{CC}$ of 5 volts is illustrated in FIG. 7, while waveforms in various parts of the portion are shown in FIG. 8.

When the Y decoder Y DEC precharged to the supply voltage $V_{CC}$ by the signal $\phi_p$ has been selected, decoding MOS transistors remain in the "off" states, and a node N remains intact at the high level, so that a MOS transistor $Q_D$ holds the "on" state. Under this condition, a pulse $\phi_y'$ indicative of the timing of the generation of the control signal $\phi_y$ is provided and is impressed on the control line YC through the MOS transistor $Q_D$. A boosting signal $\phi_B$ is subsequently applied through a capacitance $C_B$, whereby the voltage of the control line YC is boosted to produce a waveform as shown by the signal $\phi_y$. MOS transistors $Q_1$ and $Q_2$ construct a circuit which keeps the control line YC connected to the earth potential with a low impedance when this control line is non-selected, thereby to prevent the potential of th non-selected control line from rising due to any unnecessary coupled voltage.

Figure 9:
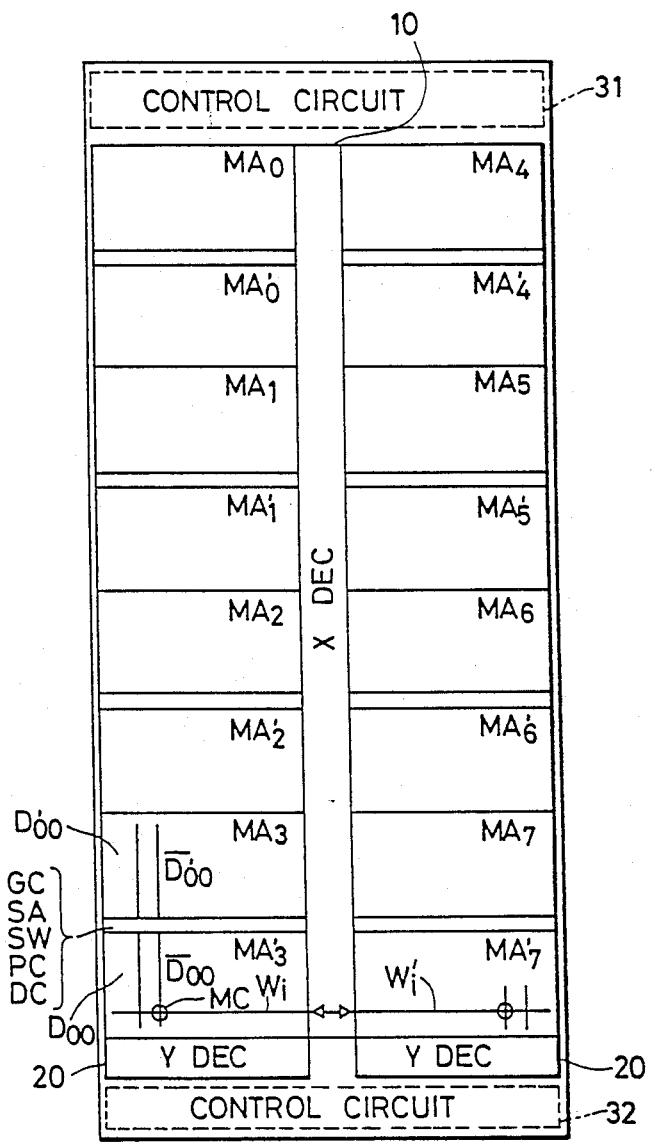
FIG. 9 is a plan view of a chip for the embodiment of FIG. 3.

FIG. 9 is a plan view showing layout on the chip of the embodiment described with reference to FIGS. 3 to 8. The chip of the present embodiment is in the shape of an elongate rectangle so that it may be readily received in the DIP (Dual In-Line Package) of the world standard. The direction of the divided data lines $D_{00}$, $D_{00}'$ etc. agrees with the lengthwise direction of the chip. The circuit block 10 including the X decoder is arranged centrally of the chip, and on both the sides thereof, the memory arrays $MA_0$, $MA_0'$, $MA_1$, $MA_1'$ etc. divided by the division of the data lines are arranged in alignment. The circuit blocks 20 including the Y decoders need not be arranged dispersely for the respective memory arrays, but each is arranged on one side the alignment of the memory arrays. The control circuits 31 and 32 are arranged in the remaining parts.

Figure 10:
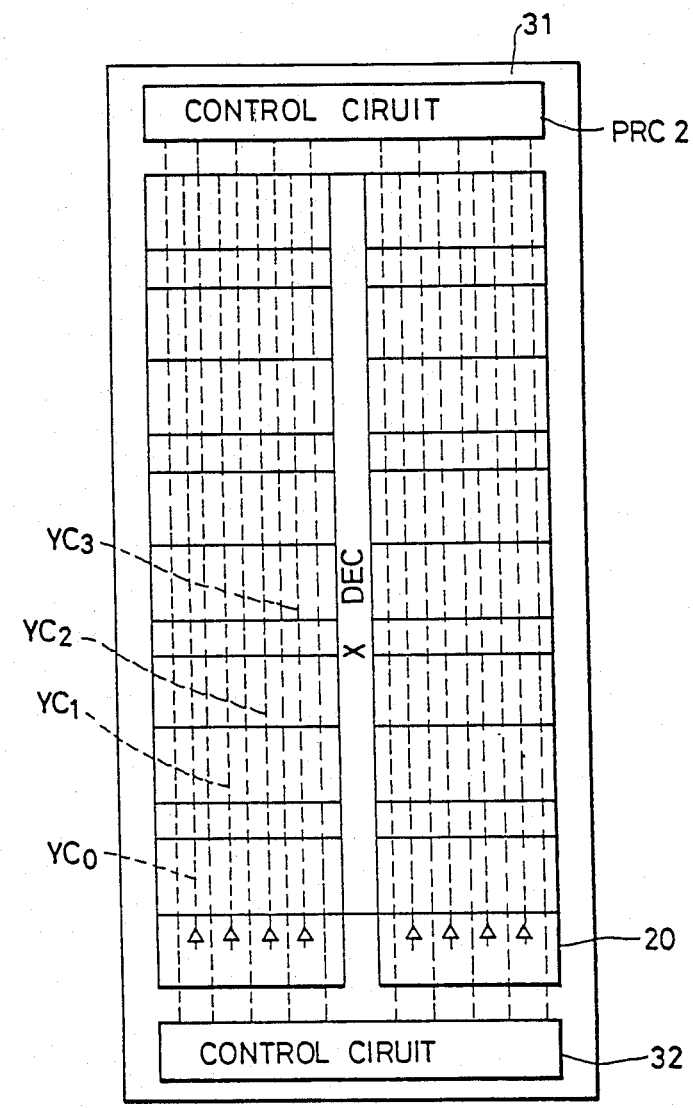
FIG. 10 is a plan view showing another chip.

The control lines YC are laid from the circuit blocks 20 including the Y decoders, in a manner to extend across the memory cells. In case the spacing between the adjacent control lines has room as in embodiments to be described later, different wiring lines associated with the control circuits 31 and 32 can be formed of the same layer as that of the control lines YC as illustrated in FIG. 10.

Figure 11:
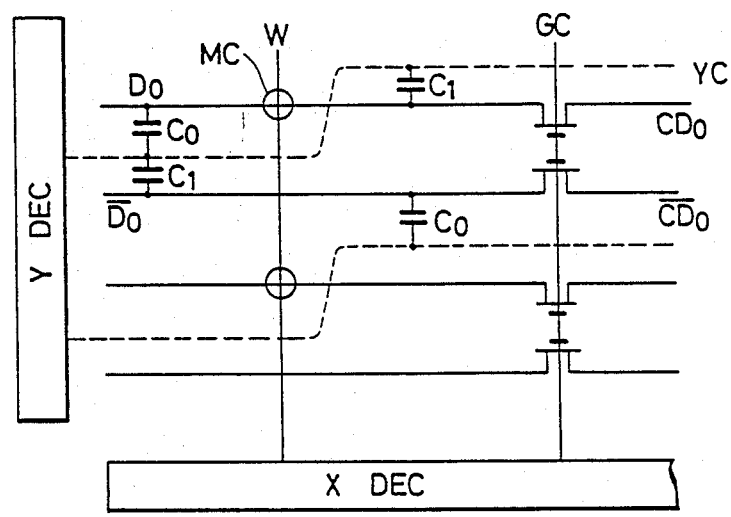
FIGS. 11 to 24 are circuit diagrams or time charts each showing another embodiment of the present invention or the operations thereof.

FIG. 11 shows an embodiment in which the embodiment of FIG. 3 to 8 is partly modified. As stated before in connection with FIG. 4A, the control line YC should desirably be arranged in the middle of the data lines $D_0$ and $\overline{D_0}$ in order to avoid the difference of the capacitances of these data lines. In this regard, however, the control line YC and the data lines $D_0$, $\overline{D_0}$ are formed of different layers. Therefore, the misregistration of masks involved in manufacturing steps incurs unequal capacitances of the lines $D_0$ and $\overline{D_0}$, which form a noise source.

In the embodiment of FIG. 11, therefore, the control lines YC are formed so as to intersect over the middle parts of the divided data lines $D_0$ etc. According to such construction, even when the mask misregistration has occurred in the manufacturing steps, both the data lines $D_0$ and $\overline{D_0}$ can equally have capacitances of $(C_0+C_1)$.

Figure 12:
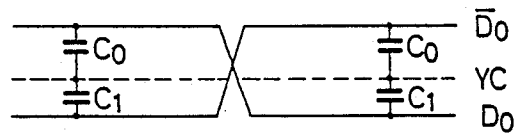

It is possible to realize various other structures in which even in the presence of the mask misregistration, no difference occurs between the capacitances of the pairing data lines as described above. Shown in FIG. 12 is an example in which the data lines $D_0$ and $\overline{D_0}$ intersect each other in their middle parts.

Figure 13:
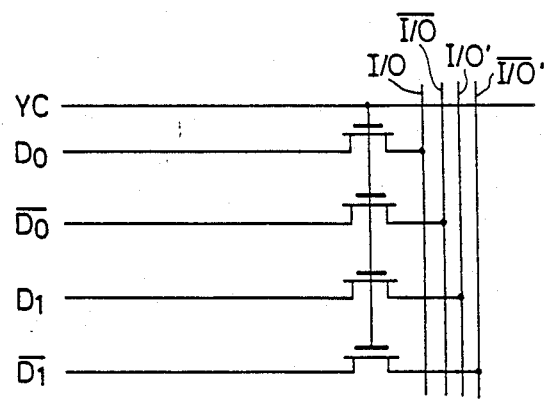
Figure 14:
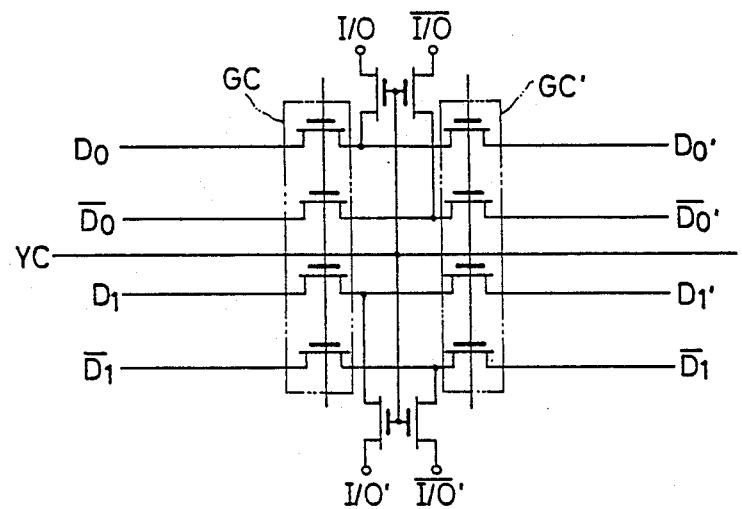

In any of the foregoing embodiments, one control line is disposed in correspondence with the pairing data lines. In order to reduce the number of control lines, a construction in which one control line is disposed for two pairs of data lines is also realizable. FIG. 13 shows the general circuit arrangement of such embodiment, while FIG. 14 shows an embodiment in the case where the switching circuits GC and GC' as shown in FIG. 3 are jointly used.

Figure 15:
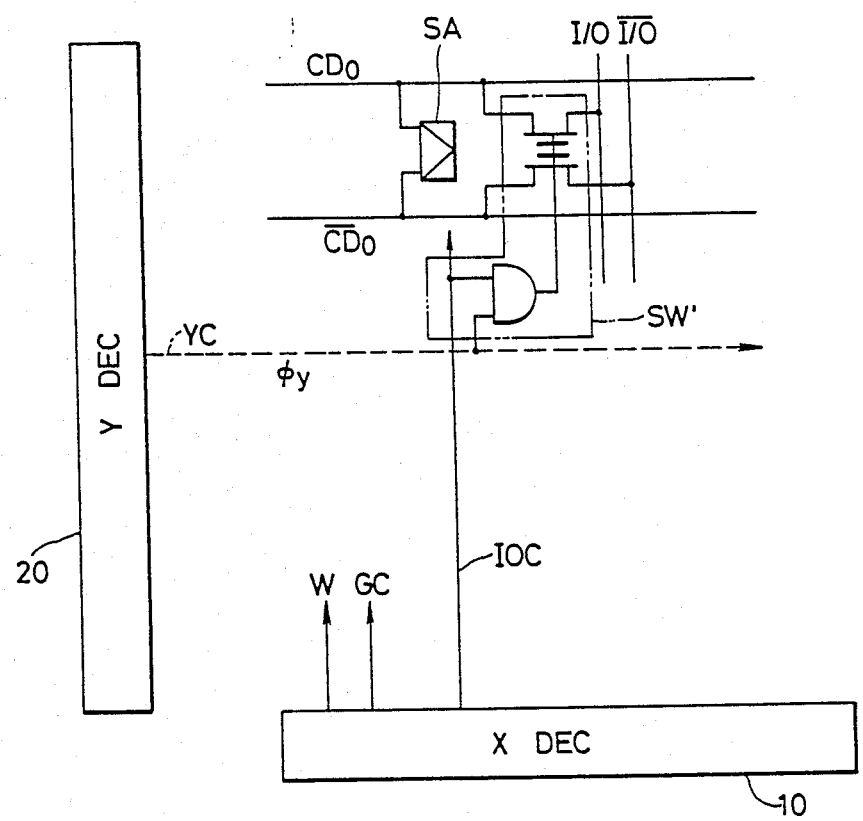

FIG. 15 shows an embodiment in which the portion of the switching circuit SW in the embodiment of FIG.

5 is modified. The modified switching circuit SW' is controlled by the control line YC and a control line IOC extending from the X decoder 10. Since only the switching circuit SW' existing at the intersection point of the selected lines X and Y turns "on", outputs can be selectively delivered to the lines I/O(0), I/O(1) etc. in FIG. 3. This signifies that the lines I/O(0), I/O(1) etc. can be decoder in advance. Therefore, a simplified circuit can be adopted for the read/write controller 30.

Figure 16:
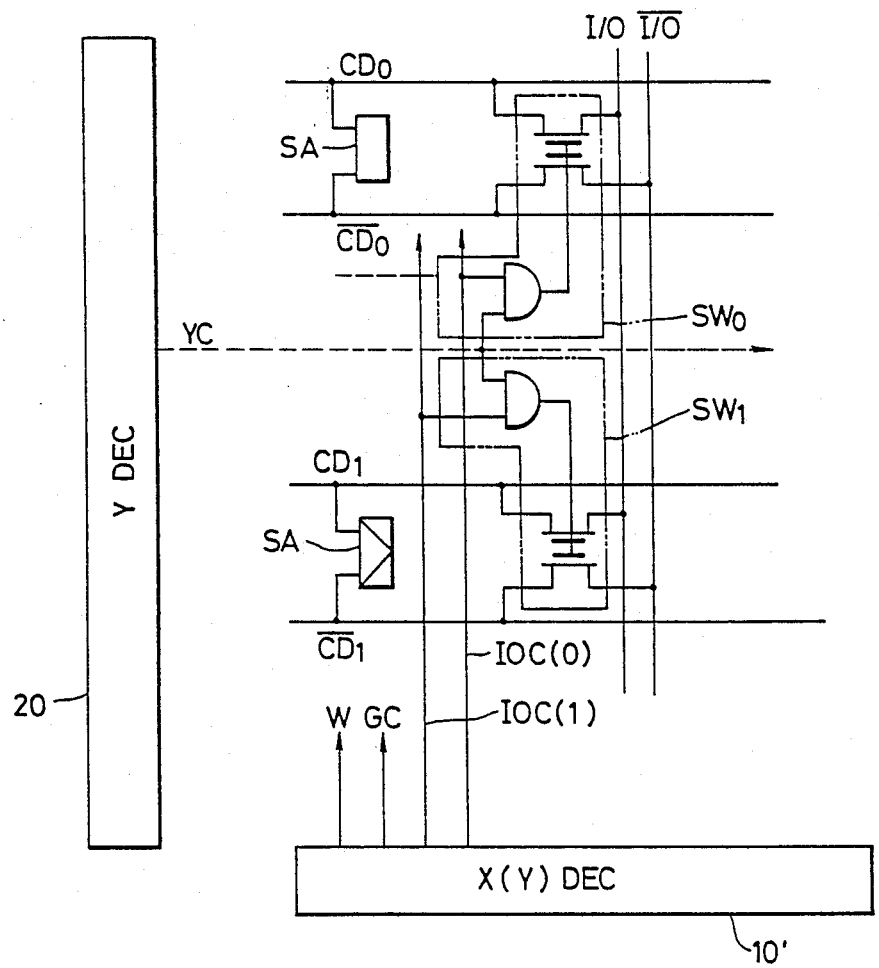

FIG. 16 shows an example in which, by expanding the idea the embodiment of FIG. 15, the control line YC is disposed in correspondence with two pairs of data lines, not each pair of data lines. Thus, the number of wired control lines YC becomes half, that is, the wiring pitch enlarges double that of the foregoing embodiments, so that the manufacture is facilitated. In operation, as in FIG. 15, the switching circuit $SW_0$ or $SW_1$ turns "on" only when the signal from the control line IOC(0) or IOC(1) and the signal from the control line YC have coincided. The present embodiment, however, differs from the embodiment of FIG. 15 in that the signal of the control line IOC(0) or IOC(1) includes an information of a Y-system address signal besides that of an X-system address signal. That is, when the pair of the data lines $D_0$ and $\overline{D_0}$ is selected, the line IOC(0) is selected by the X(Y) decoder 10', and when the pair of the data lines $D_1$ and $\overline{D_1}$ is selected, the line IOC(1) is selected (usually, a signal "1" is provided), Needless to say, the aforementioned X- and Y-system address signals simply signify X and Y in the arrangement of two-dimensional points in plane, and they should be discriminated from the logic addresses of the memory.

While the control line YC is disposed in correspondence with the two pairs of data lines herein, it is needless to say that each control line YC can be disposed in correspondence with any desired number of pairs of data lines.

Figure 17:
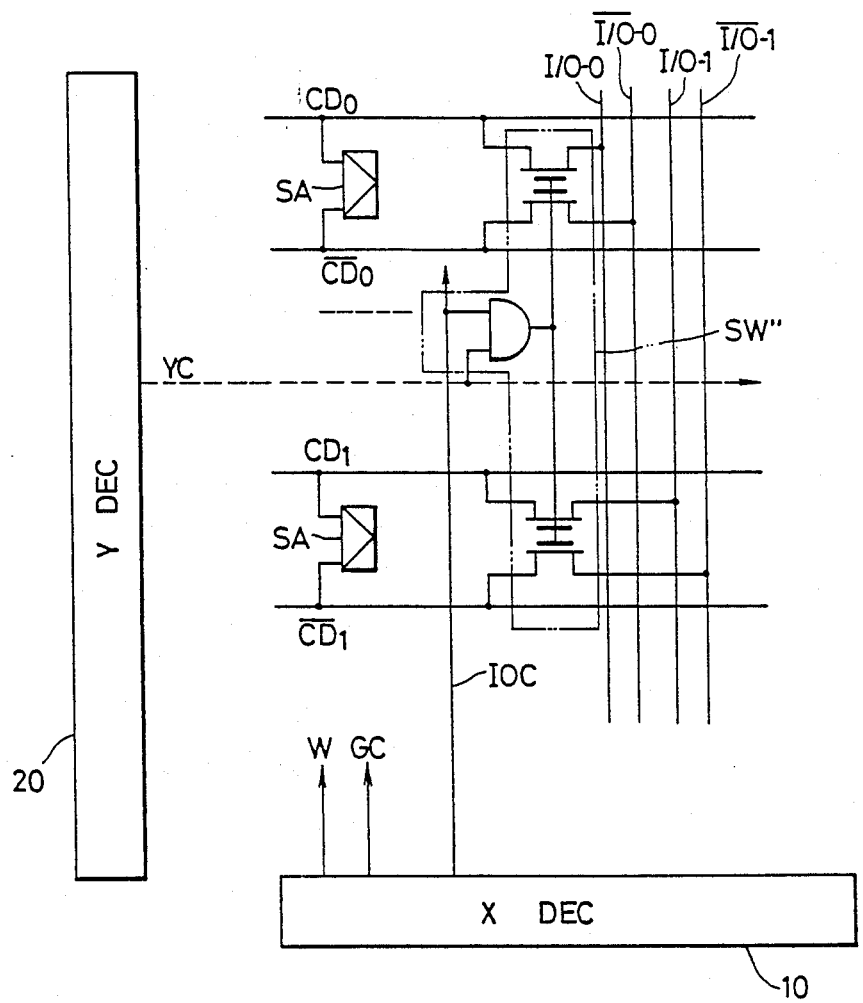

FIG. 17 shows another embodiment in which the wiring pitch of the lines YC is enlarged, for example, double likewise to the above. Here, two sets of I/O lines are disposed, and tho lines I/O—0 and $\overline{I/O}$—0 are connected to the lines $CD_0$ and $\overline{CD_0}$ and the lines I/O—1 and $\overline{I/O}$—1 to the lines $CD_1$ and $\overline{CD_1}$ by a switching circuit SW", respectively, so as to exchange signals with the exterior. The two sets of I/O lines have either selected and connected with the line $D_i$ or $D_{out}$ by the read/write controller 30 shown in FIG. 2 by way of example. Alternatively, it is possible to dispose a plurality of lines $D_i$ or $D_{out}$ and to directly connect the I/O lines therewith without performing the selecting operation.

With the present embodiment, as in the embodiment of FIG. 16, the wiring pitch of the control lines YC can be enlarged and the manufacture is facilitated.

Figure 18:
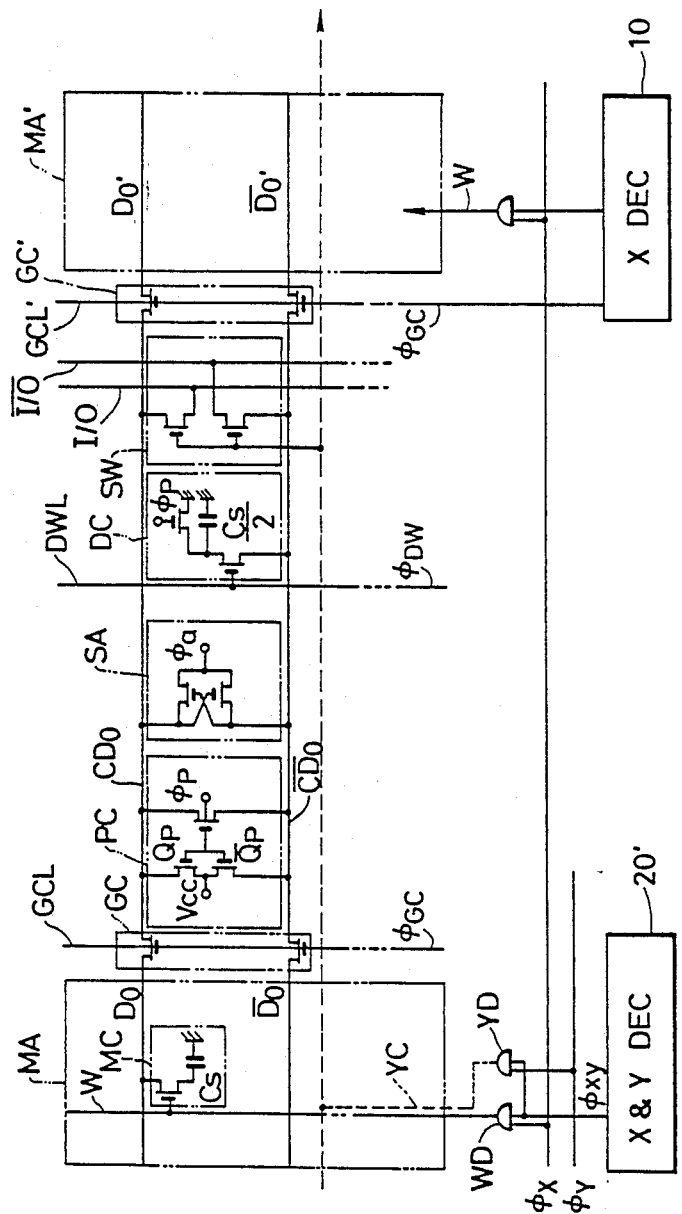
Figure 19:
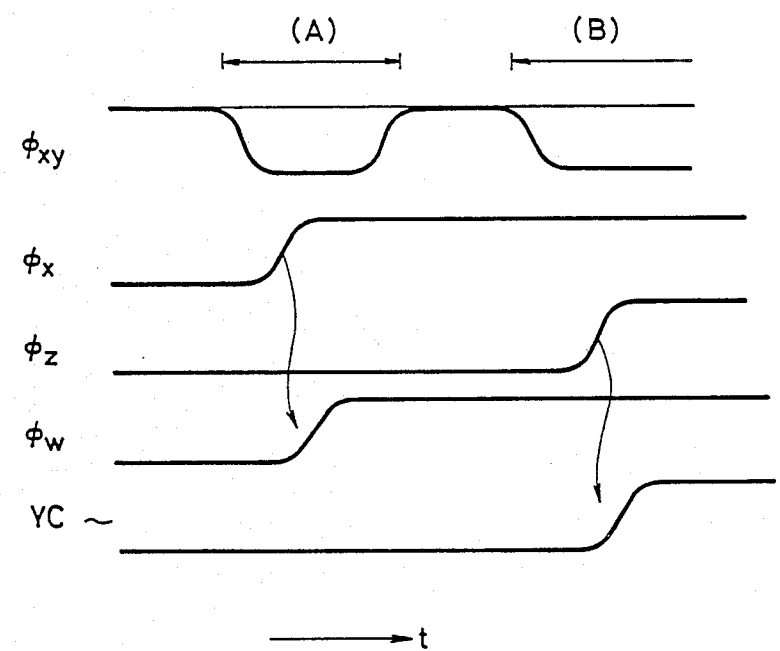

While the embodiments thus far described are based on the structure of FIG. 3, it is obvious that the X and Y decoders can be arranged in proximity. FIG. 18 shows an embodiment therefor. In the foregoing embodiment of FIG. 5, the Y decoder 20 is replaced with an X and Y decoder 20'. As illustrated in FIG. 19, the X and Y decoder 20' carries out the operation (A) of the X decoder and the operation (B) of a Y decoder in divided time zones. The coincidence between a pulse $\phi_{xy}$ and a pulse $\phi_x$ or $\phi_y$ is taken by a gate circuit WD or YD so as to form the output of the word line W or the control line YC. In the concrete, the gate circuits WD and YD are similar in arrangement to the circuit shown in FIG. 7. Therefore, they are not described in detail.

In FIG. 18, the circuit block 10 shown in the right-hand part of the drawing is not given the function of the Y decoder. This is based on the assumption that the number of decoders required for driving the control lines YC is within the number of decoders located in the left-hand part of the drawing, and the same function as that of the left decoders is sometimes given to the right decoders 10. In case the juxtaposed design of the gate circuis WD and YD is difficult in relation to the occupying area, the gate circuit YD can be designed in a manner to be distributed among a plurality of decoder portions.

Figure 20:
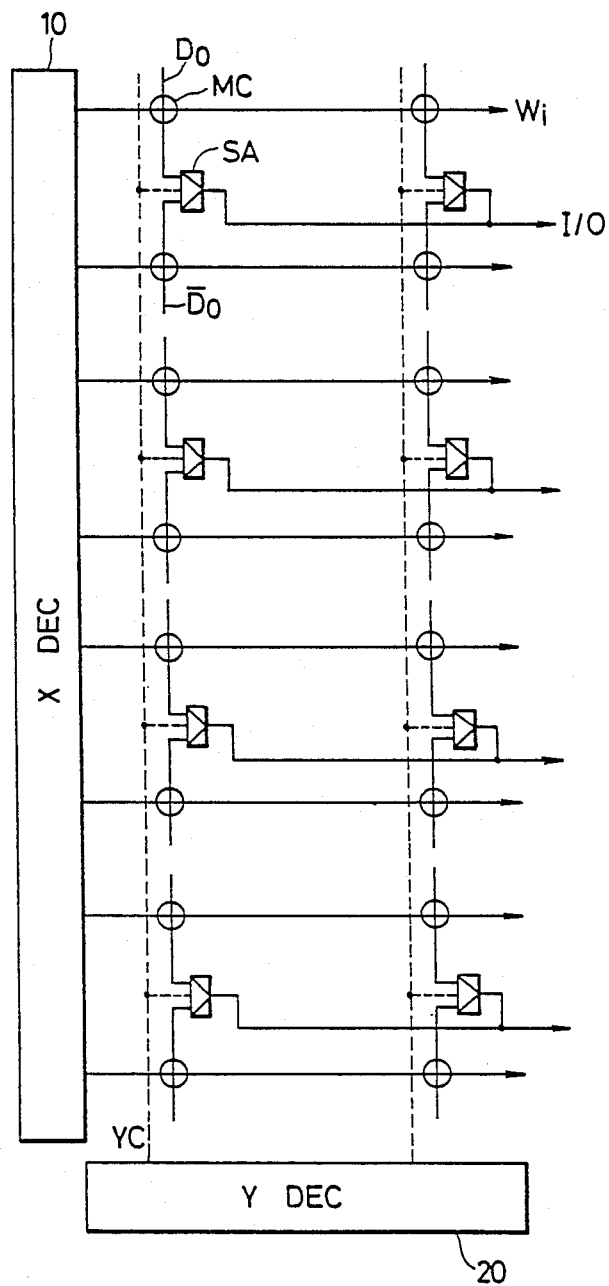

Whereas the embodiments thus far described are directed to the memory of the folded data line arrangement, an embodiment shown in FIG. 20 is directed to a memory of the open data line arrangement. Also in this embodiment, each data line is divided into a plurality of sub lines in the lengthwise direction. Different from the embodiment of FIG. 3 is that the pairing data lines $D_0$ and $\overline{D_0}$ are arranged rectilinearly. In the embodiment of FIG. 3, polycrystalline silicon being a wiring material of comparatively high resistivity is used for the word lines and the word line delay time therefore poses a problem, so that to the end of making the time as short as possible, the word lines are divided to arrange the circuit block 10, including the X decoder and drivers, in the central position of the divided lines as illustrated in FIG. 3. In contrast, in the embodiment of FIG. 20, the word lines are formed of Al exhibiting a low resistivity, so that the word lines need not be divided and that the circuit block 10 is arranged at one end. Thus, one driver may be disposed on one side, and hence, the area of the circuit blocks 10 can be made small.

Figure 21:
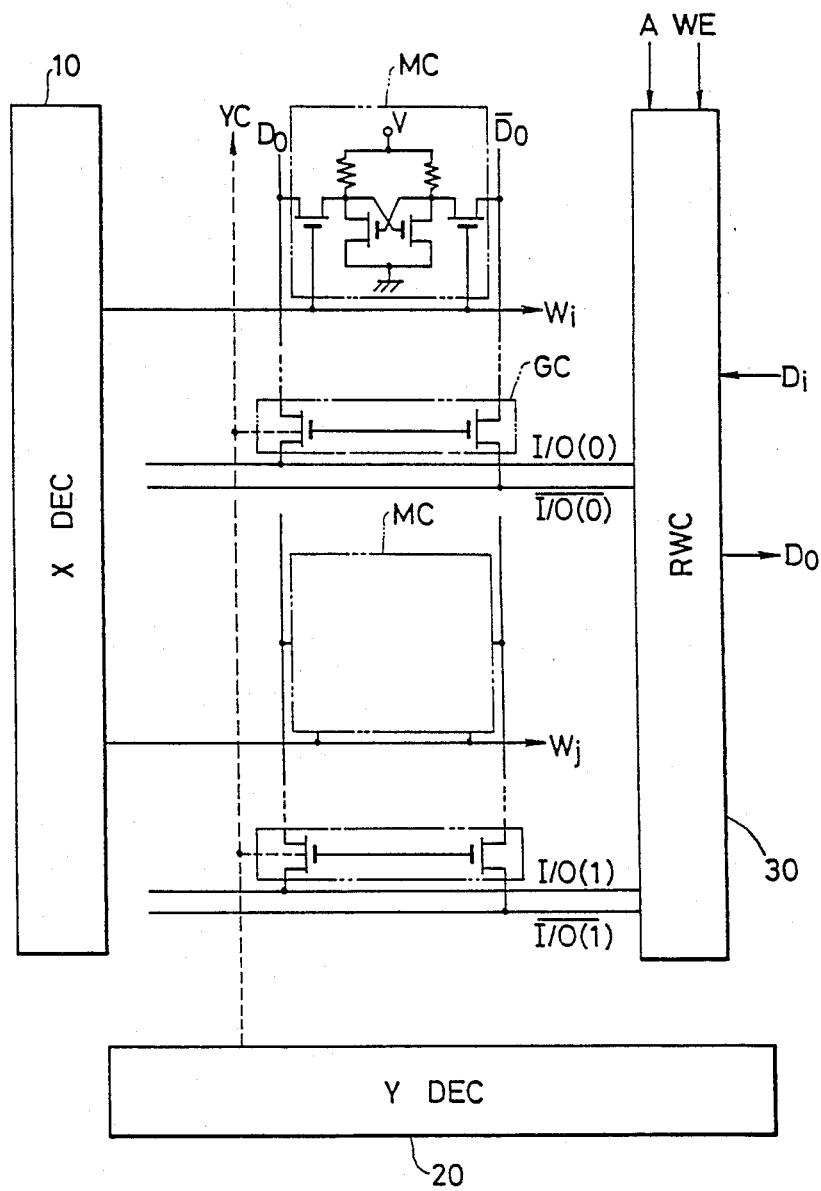

FIG. 21 shows an embodiment in which the present invention is applied to a MOS static memory. When compared with the embodiments of the MOS dynamic memory shown in detail in FIG. 5, etc., the present embodiment differs in the structure of the memory cell MC and also differs in that the auxiliary circuits such as the sense amplifier are not required for the respective pairs of data lines. The pairing data lines $D_0$, $\overline{D_0}$, the common input/output lines I/O, $\overline{I/O}$, the control line YC, the switching circuit GC, etc. may be constructed similarly to those in FIG. 5, and are not described in detail.

Figure 22:
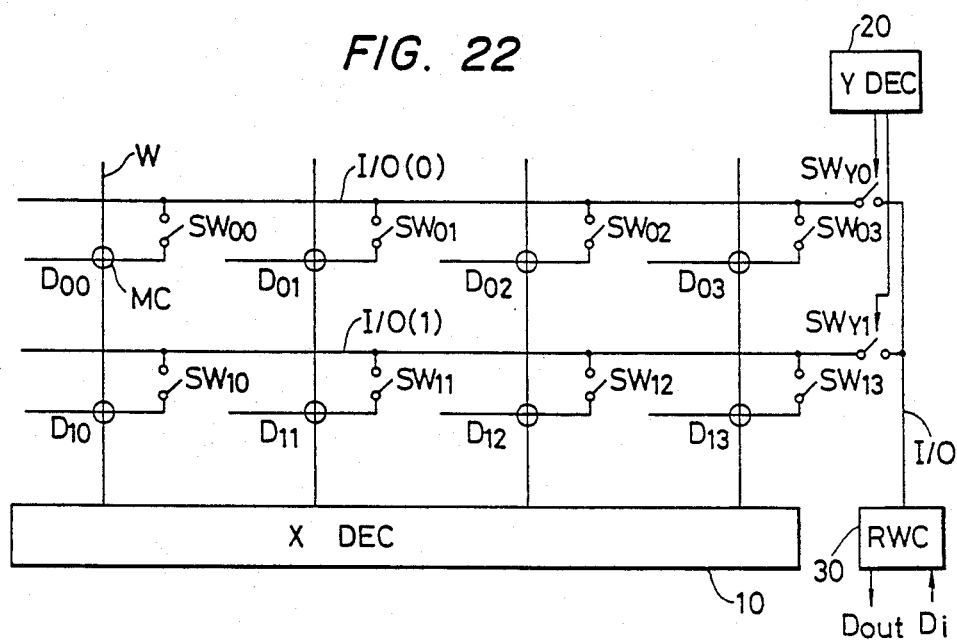

FIG. 22 show the conceptual construction of an embodiment in which the sense of the common input/output line common to a plurality of divided data lines is different from that in the various embodiments thus far described.

That is, the common input/output line I/O(0) which is common to the divided data lines $D_{00}$, $D_{01}$, $D_{02}$ and $D_{03}$ is disposed in parallel with these data lines.

Figure 23:
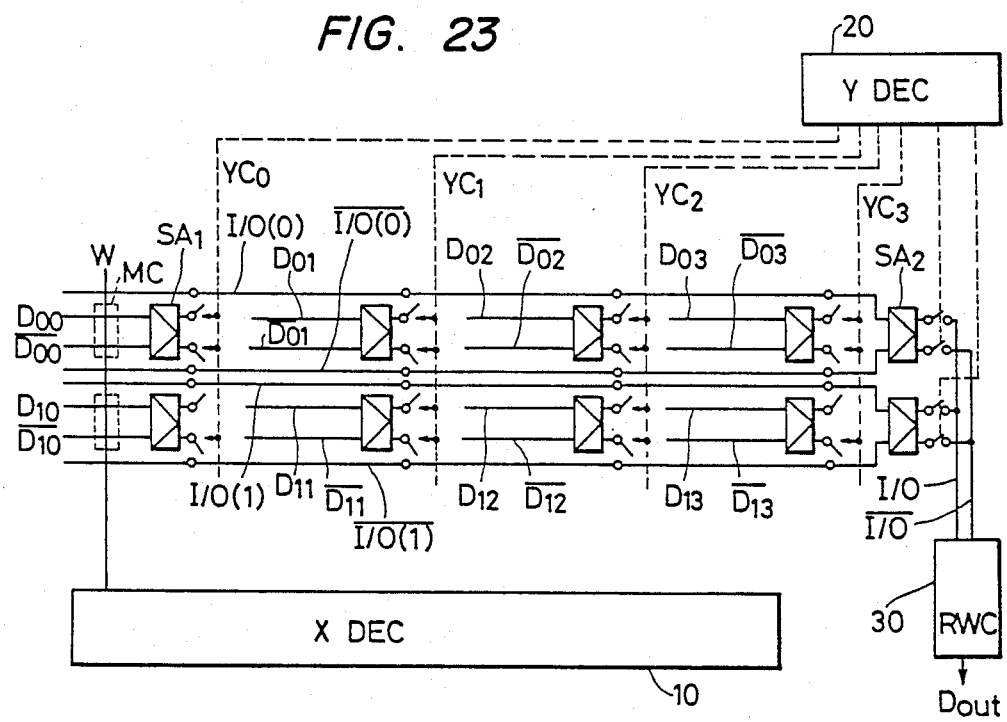

FIG. 23 illustrates more concretely an embodiment to which the structure of FIG. 22 is applied.

A sense amplifier $SA_1$ of a first stage is connected to the pairing divided data lines $D_{00}$ and $\overline{D_{00}}$. Sense amplifiers of the first stage are respectively connected to the other pairing divided data lines.

Pairing common input/output lines I/O(0) and $\overline{I/O(0)}$ are disposed in correspondence with the data lines forming a row, and are connected to a sense amplifier $SA_2$ of a second stage. Pairing common input/output lines I/O(1) and $\overline{I/O(1)}$ are similarly disposed in correspondence with data lines of another row, and are connected to a sense amplifier of the second state. Outputs from the sense amplifiers of the first stage arrayed in a first column are connected to the respectively corresponding common input/output lines through switches which are controlled by a control line $YC_0$ disposed in a direction intersecting the common input/output lines. Outputs from the sense amplifiers arrayed in the other columns are similarly connected to the corresponding common input/output lines through switches which are respectively controlled by control lines $YC_1$, $YC_2$ and $YC_3$. These control lines are selectively driven by the circuit block 20 including the Y decoder. The selection in the digit direction is performed on the output side of the sense amplifiers of the second stage by the Y decoder.

Also in such embodiment, the information of the memory cell MC is once read out onto the divided data line, and it is amplified by the sense amplifier of the first stage and then delivered to the common input/output line. Therefore, even when the charge storage capacity of the memory cell is small, the information can be read out with a sufficient margin.

Since the selective drive of the control lines $YC_0$, $YC_1$, $YC_2$ and $YC_3$ serves to effect the selectio in the word direction, it may well be performed by the circuit block 10 including the X decoder.

Figure 24:
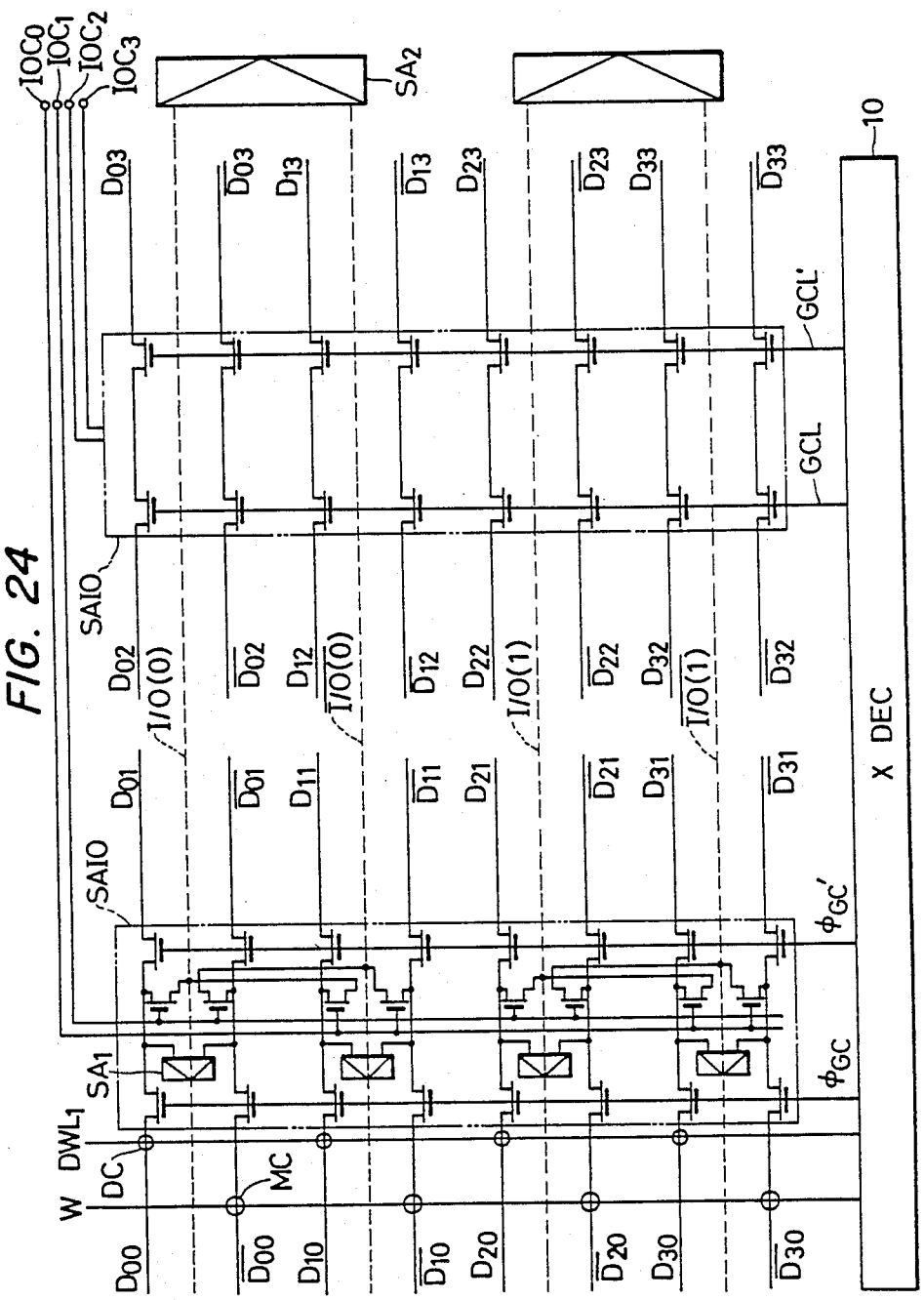

FIG. 24 shows another embodiment to which the construction of FIG. 22 is applied. The point of difference of the present embodiment from the embodiment of FIG. 23 is that the pairing common input/output lines I/O(0) and $\overline{I/O(0)}$ are disposed in common to two pairs of data line columns. Also control lines for controlling the switching circuits pair as $IOC_0$ and $IOC_1$, or $IOC_2$ and $IOC_3$, and by driving either, one of the two pairs of data line columns is selected. Also the sense amplifier $SA_1$ of the first stage is disposed in common to the data line pair $D_{00}$, $\overline{D_{00}}$ and the data line pair $D_{01}$, $\overline{D_{01}}$, either of which is selected by the switching circuit which is controlled by control signals $\phi_{GC}$ and $\phi_{GC}'$ from the circuit block 10 including the X decoder.

We claim:

1. A semiconductor memory comprising:
   a plurality of arrays, each having a plurality of data lines, a plurality of word lines disposed in such a manner as to cross said data lines, and memory cells including capacitors disposed at predetermined points of intersection between said word lines and said data lines for storing predetermined signals and transistors electrically connecting said capacitors to said data lines, wherein two of said data lines are disposed in a pair adjacent to and in parallel with each other in such a manner that they have mutually different signals and are connected to corresponding differential amplifiers;
   common signal lines disposed in common to at least four of said data lines;
   first switching means for connecting said data lines to said common signal lines corresponding thereto;
   control lines for transmitting signals for controlling said first switching means;
   first decoder means for selecting at least one of said word lines; and
   second decoder means for controlling the connection between selected data lines and said common signal lines through said control lines,
   wherein a voltage impressed on said selected word lines is higher than at least one of a predetermined high voltage appearing on said selected data lines and a predetermined power supply voltage.

2. A semiconductor memory according to claim 1, wherein said common signal lines are disposed at intermediate portions of said arrays and are disposed in common to said data lines belonging to said arrays on both sides thereof.

3. A semiconductor memory according to claim 1 or 2, wherein said control lines are disposed in parallel with said data lines.

4. A semiconductor memory according to claim 1, wherein a majority of said control lines are disposed in a layer different from that of said data lines.

5. A semiconductor memory according to claim 1, wherein said data lines and said control lines are made of aluminum.

6. A semiconductor memory according to claim 1, wherein said control lines and said data lines are disposed in such a manner as to cross one another.

7. A semiconductor memory according to claim 1, wherein said first and second decoder means include driver means for driving the selected lines, respectively.

8. A semiconductor memory according to claim 1, wherein two of said data lines together constitute a pair of a folded bit structure and said common signal lines are disposed also in pairs.

9. A semiconductor memory according to claim 1, wherein said second decoder means includes means acting to fix non-selected control lines to a predetermined non-selection potential.

10. A semiconductor memory according to claim 1, wherein means for generating a reference voltage is disposed for each of said data lines.

11. A semiconductor memory comprising:
    a plurality of memory arrays, each having a plurality of data lines, a plurality of word lines disposed in such a manner as to cross said data lines, and memory cells including capacitors disposed at predetermined points of intersection between said word lines and said data lines for storing predetermined signals and transistors electrically connecting said capacitors to said data lines, wherein two of said data lines are disposed in a pair adjacent to and in parallel with each other in such a manner that they have mutually different signals and are connected to corresponding differential amplifiers;
    common signal lines disposed in common to at least four of said data lines;
    first switching means for connecting said data lines to said common signal lines corresponding thereto;
    control lines for transmitting signals for controlling said first switching means;
    first decoder means for selecting at least one of said word lines; and
    second decoder means for controlling the connection between said data lines and said common signal lines through said control lines,
    wherein at least 6 of said memory cell arrays are disposed in at least an eight-by-eight arrangement in a longitudinal direction of a chip and said differential amplifiers are disposed between two of said memory arrays disposed in at least the eight-by-eight arrangement, and further wherein at least one peripheral circuit is disposed on said chip adjacent to said memory arrays.

12. A semiconductor memory comprising:
    a plurality of memory arrays, each having a plurality of data lines, a plurality of word lines disposed in such a manner as to cross said data lines, and memory cells including capacitors disposed at predetermined points of intersection between said word lines and said data lines for storing predetermined signals and transistors coupled for electrically connecting said capacitors to said data lines, wherein two of said data lines are disposed in a pair adjacent to and in parallel with each other in such a manner that they have mutually different signals and are connected to corresponding differential amplifiers;

common signal lines disposed in common to at least four of said data lines;

first switching means for connecting said data lines to said common signal lines corresponding thereto;

control lines for transmitting signals for controlling said first switching means;

first decoder means for selecting at least one of said word lines; and second decoder means for controlling the connection between said data lines and said common signal lines through said control lines, wherein said differential amplifiers and said common signal lines are disposed in such a manner that they are shared by at least two of said memory arrays and are disposed between said two memory arrays.

13. A semiconductor memory comprising:

a plurality of memory arrays, each having a plurality of data lines, a plurality of word lines disposed in such a manner as to cross said data lines and memory cells disposed at predetermined points of intersection between said word lines and said data lines, wherein two of said data lines are disposed in a pair in such a manner that they have mutually different signals and are connected to corresponding differential amplifiers;

common signal lines disposed on common to at least four of said data lines;

first switching means for connecting said data lines to said common signal lines corresponding thereto;

control lines for transmitting signals for controlling said first switching means;

first decoder means for selecting at least one of said word lines; and second decoder means for controlling the connection between said data lines and said common signal lines through said control lines, wherein each of said memory cells includes a capacitor for storing a signal and an insulated gate transistor for electrically connecting said capacitor to said data line, wherein at least one of the electrodes constituting said capacitor is formed of a first conductive layer, wherein the gate electrode of said insulated gate transistor is formed of a second conductive layer, wherein said data line is formed of a third conductive layer, and wherein a fourth conductive layer is used for wiring.

14. A semiconductor memory comprising:

a plurality of memory arrays, each having a plurality of data lines, a plurality of word lines disposed in such a manner as to cross said data lines, and memory cells including capacitors disposed at predetermined points of intersection between said word lines and said data lines for storing predetermined signals and transistors electrically connecting said capacitors to said data lines, wherein two of said data lines are disposed in a pair adjacent to and in parallel with each other in such a manner that they have mutually different signals and are connected to corresponding differential amplifiers;

a plurality of common signal lines disposed in common to at least four of said data lines;

first switching means for connecting said data lines to said common signal lines corresponding thereto;

control lines for transmitting signals for controlling said first switching means;

first decoder means for selecting at least one of said word lines; and second decoder means for controlling the connection between said data lines and said common signal lines through said control lines, wherein first and second common signal lines are disposed adjacent to each other, wherein a common control signal is applied to said first switching means for connecting said respective common signal lines to first and second data line pairs corresponding thereto, and wherein said first and second data line pairs belong to the same memory array.

15. In a semiconductor memory comprising:

a plurality of memory arrays, each having a plurality of data lines, a plurality of word lines disposed in such a manner as to cross said data lines, and memory cells disposed at predetermined points of intersection between said word lines and said data lines for storing signals and transistors electrically connecting said capacitors to said data lines;

differential amplifiers for amplifying information read out of said memory cells;

dummy cells for providing reference signals to said differential amplifiers;

a plurality of common signal lines disposed in common to at least two of said data lines;

first switching means for connecting said data lines to said common signal lines corresponding thereto;

control lines for transmitting signals for controlling said first switching means;

first decoder means for selecting at least one of said word lines; and second decoder means for controlling the connection between said data lines and said common signal lines through said control lines, wherein said dummy cell is disposed in common to at least two of said data lines.

* * * * *